United States Patent [19]
Khang

[11] Patent Number: 6,049,503
[45] Date of Patent: Apr. 11, 2000

[54] WORDLINE DRIVING CIRCUIT IN SEMICONDUCTOR MEMORY

[75] Inventor: Chang Man Khang, Kyungki-do, Rep. of Korea

[73] Assignee: LG Semicon Co., Ltd., Cheongju-Si, Rep. of Korea

[21] Appl. No.: 09/166,075

[22] Filed: Oct. 5, 1998

[30] Foreign Application Priority Data

Oct. 28, 1997 [KR] Rep. of Korea ...................... 97/55655

[51] Int. Cl.[7] .................................................. G11C 8/00
[52] U.S. Cl. ..................................... 365/230.06; 365/206
[58] Field of Search ................................ 365/230.06, 206

[56] References Cited

U.S. PATENT DOCUMENTS

| | | | |
|---|---|---|---|
| 4,747,083 | 5/1988 | Nakajima et al. ................. | 365/230.06 |
| 5,222,047 | 6/1993 | Matsuda et al. .................... | 365/230.03 |
| 5,371,714 | 12/1994 | Matsuda et al. .................... | 365/230.03 |
| 5,517,456 | 5/1996 | Chishiki ............................. | 365/230.06 |
| 5,802,008 | 9/1998 | Park et al. .......................... | 365/230.06 |
| 5,808,955 | 9/1998 | Hwang et al. ..................... | 365/230.06 |
| 5,818,790 | 10/1998 | Kim et al. .......................... | 365/230.06 |
| 5,896,345 | 4/1999 | Sohn ................................... | 365/230.06 |
| 5,933,388 | 8/1999 | Choi ................................... | 365/230.06 |

OTHER PUBLICATIONS

Nakamura et al, "A 29ns 64Mb DRAM with Hierarchical Array Architcture", pp. 1–6, 9 & 11.

Noda et al, "A Boosted Dual Word–line Decoding Scheme for 256Mb DRAMs", 1992 Symposium on VLSI Circuits Digest of Technical Papers, pp. 112–113.

Sugibayashi et al, ISSCC 93/Session3/non–volatile dynamic and experimental memories/paper Wp3.5, 1993 IEEE International Solid–State Circuits Conference, pp. 50–51.

*Primary Examiner*—Trong Phan

[57] ABSTRACT

The wordline driving circuit includes a noise prevention circuit in each control circuit of a subwordline drive selector. When a row signal from a sub-row decoder indicates that the associated control circuits are not to drive wordlines associated therewith, the noise prevention circuit in each control circuit is triggered to remove noise from the wordline.

16 Claims, 5 Drawing Sheets

WORDLINE DRIVING CIRCUIT IN SEMICONDUCTOR MEMORY

BACKGROUND OF THE INVENTION

1. Field of the Invention

The present invention relates to a semiconductor memory device, and more particularly, to a wordline driving circuit in a semiconductor memory device which is capable of removing noise from wordlines associated therewith when those wordlines are not being driven.

2. Description of Related Art

FIG. 1 illustrates a portion of a conventional wordline driving circuit. As shown, a sub-row decoder 1 is connected to a plurality of subwordline selectors 2. Each of the subwordline selectors 2 is connected to a wordline W/L and an enable line WD. The structure of each subwordline selector 2 is the same. Therefore, the structure and operation of only the subwordline selector 2 for the first wordline W/L1 will be described.

As shown in FIG. 1, the subwordline selector 2 for the first wordline W/L1 includes a PMOS transistor MP connected in series with an NMOS transistor MN between the first enable line WD and ground. The gates of the PMOS and NMOS transistors MP and MN receive the row signal output by the sub-row decoder 1, and the junction between the PMOS and NMOS transistors MP and MN drive the first wordline W/L1.

In operation, the sub-row decoder 1 decodes an address and generates a row signal. The row signal will be logic high if a memory cell specified in the address is not a memory cell associated with any of the subwordline selectors 2 connected to the sub-row decoder 1. However, if the memory cell identified in the address is associated with one of the subwordline selectors 2, the sub-row decoder 1 generates a logic low row signal.

When the sub-row decoder 1 generates a logic high row signal, the NMOS transistor in each of the subwordline selectors 2 turns on and pulls the associated wordline W/L to logic low. When the sub-row decoder 1 generates a logic low row signal, the NMOS transistor MN is off, and the PMOS transistor MP turns on. Accordingly, the PMOS transistor MP in each subwordline selector 2 supplies the associated enable signal WD to the associated wordline W/L. One of the enable signals WD will be logic high and the remainder low such that only one of the wordlines W/L is driven.

Unfortunately, however, due to the reduction in memory cell size and the design considerations resulting therefrom, noise can develop on a wordline W/L even when supplied with a logic high row signal such that the wordline W/L is erroneously driven.

SUMMARY OF THE INVENTION

One object of the present invention is to provide a wordline driving circuit which overcomes the disadvantages and the drawbacks of conventional wordline driving circuits.

Another object of the present invention is to provide a wordline driving circuit capable of removing noise from the wordlines which are not being driven.

These and other objects are achieved by providing a wordline driving circuit, comprising: at least one sub-row decoder decoding address signals to generate at least a first row signal; and at least one subwordline drive selector associated with the sub-row decoder and including at least a first control circuit, the first control circuit receiving the first row signal and a first enable signal, the first control circuit driving at least a first wordline when the first row signal and the first enable signal are active, and the first control circuit including a first noise prevention circuit which eliminates noise in the first wordline when the first row signal is inactive.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Figure 4:
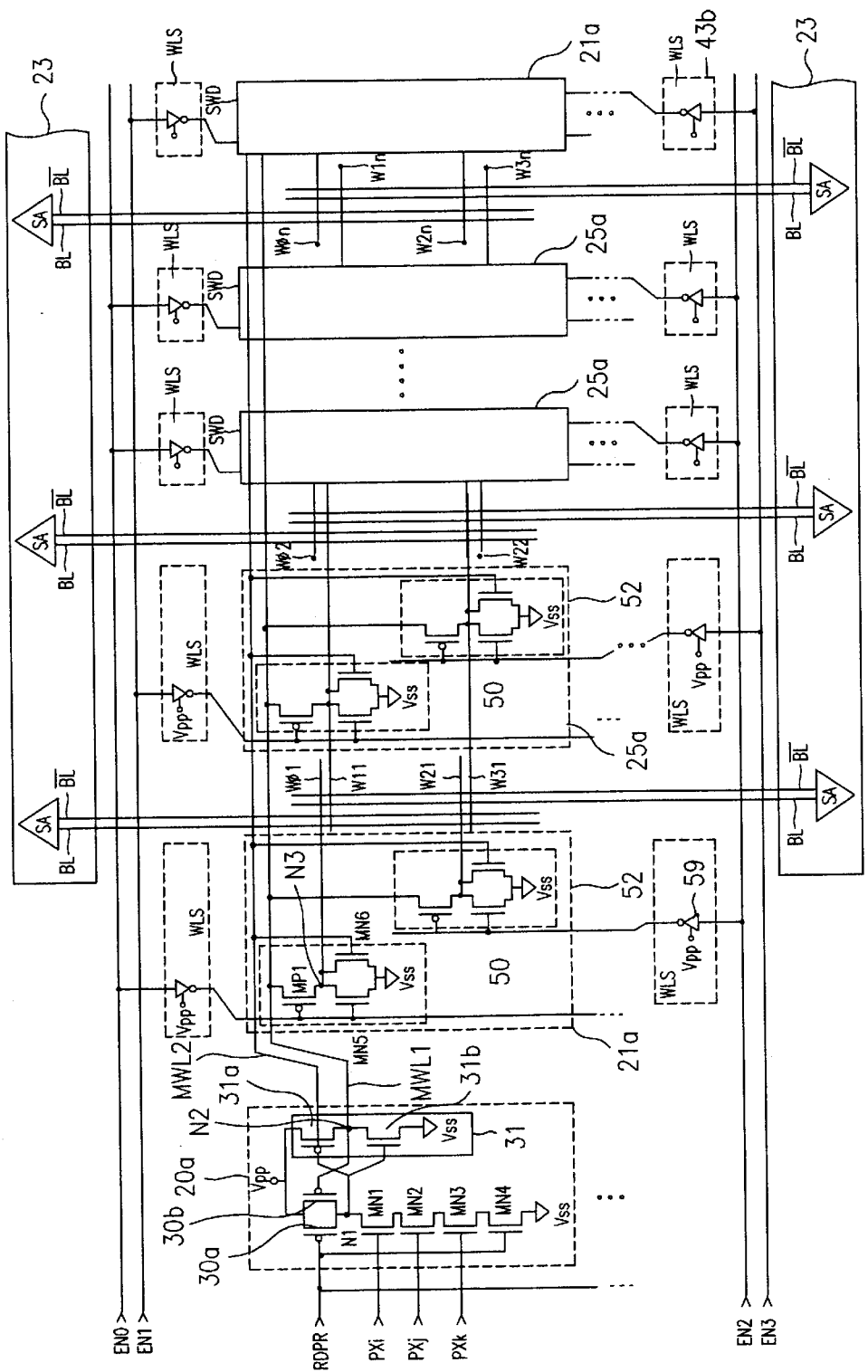
FIG. 4 illustrates a portion of a wordline driving circuit according to the present invention.

FIG. 4 illustrates a portion of a wordline driving circuit according to the present invention. As shown, the wordline driving circuit includes a sub-row decoder 20a which receives a row decoding precharge (RDPR) signal and address signals PXi–PXj, and outputs a first row signal on first row line L1 and a second row signal on second row line L2. A plurality of first type subwordline selectors 21a and a plurality of second type subwordline selectors 25a are connected to the first and second row lines L1 and L2.

The first type of subwordline selectors 21a include first and second control circuits 50 and 52. Each of the first and second control circuit 50 and 52 selectively drives a wordline W. Similarly the second type of subwordline selectors 25a include the first and second control circuits 50 and 52, having the same structure as the control circuit in the first type of subwordline selectors 21a; and therefore, the same reference numerals. The difference between the first and second types of subwordline selectors 21a and 25a is that the drive signal produced by the first and second controls circuits 50 and 52 in the second type of subwordline selectors 25a are supplied to two wordlines W. Accordingly, hereinafter, the first and second type of subwordline selectors 21a and 25a will jointly be referred to as the subwordline selectors 21a and 25a.

Bit and bit bar lines BL and BL(bar) are disposed perpendicular to the wordlines Ws and load data from memory cells driven by a wordline W. A sense amplifier array 23 is disposed on either side of the array of subwordline selectors 21a and 25a associated with the sub-row decoder 20a. The sense amplifier arrays 23 include a sense amplifier SA associated with each pair of bit and bit bar lines BL and BL (bar).

As further shown in FIG. 4, first-fourth initial enable lines EN0-EN3 supply first-fourth initial enable signals to the array of subwordline selectors 21a and 25a associated with the sub-row decoder 20a. Counting from left to right in FIG. 4, the first control circuit 50 in each odd numbered subwordline selector 21a and 25a is connected to the first initial enable line EN0 via an enable signal supplier WLS, the first control circuit 50 in each even numbered subwordline selector 21a and 25a is connected to the second initial enable line EN1 via an enable signal supplier WLS, the second control circuit 52 in each odd numbered subwordline selector 21a and 25a is connected to the third initial enable line EN2 via an enable signal supplier WLS, and the second control circuit 52 in each even numbered subwordline selector 21a and 25a is connected to the fourth initial enable line EN3 via an enable signal supplier WLS.

As further shown in FIG. 4, the sub-row decoder 20a includes first and second homo junction PMOS transistors 30a and 30b connected in parallel to a power source voltage Vpp. First-fourth NMOS transistors MN1–MN4 are connected in series between the drains of the first and second homo junction PMOS transistors 30a and 30b and ground Vss. The gates of the first homo junction PMOS transistor 30a and the gate of the fourth NMOS transistor MN4 receive the RDPR signal, and the gates of the first-third NMOS transistors MN1–MN3 receive the address signals PXi–PXk. The junction between the first NMOS transistor MN1 and the first and second homo junction PMOS transistors 30a and 30b serves as a first node N1 which outputs the first row signal.

The sub-row decoder 20a also includes a CMOS inverter 31. The CMOS inverter 31 includes an inverter PMOS transistor 31a and an inverter NMOS transistor 31b connected in series between the power source voltage Vpp and ground Vss. The gates of the inverter PMOS and NMOS transistors 31a and 31b are connected to the first node N1. The junction between the inverter PMOS and NMOS transistors 31a and 31b serves as a second node N2 which outputs a second row signal having an opposite logic state of the first row signal. The gate of the second homo junction PMOS transistor 30b is connected to the second node N2. The first and second lines L1 and L2 are connected to the first and second nodes N1 and N2, respectively, to supply the first and second row signals, respectively.

Next, the structure of the first control circuit 50 will be described. As shown in FIG. 4, the first control circuit 50 includes a first PMOS transistor MP1 and a fifth NMOS transistor MN5 connected in series between the first row line L1 supplying the first row signal and ground Vss. A junction of the first PMOS transistor MP1 and a fifth NMOS transistor MN5 serves as a third node N3 and is connected to one wordline W in the first type of subwordline selectors 21a and is connected to two wordlines Ws in the second type of subwordline selectors 25a. A sixth NMOS transistor MN6 is connected between the wordline(s) and ground, and has its gate connected to the second row line L2 to receive the second row signal.

Counting from left to right, the gates of the first PMOS transistors MP1 and the fifth NMOS transistors MN5 in the odd numbered subwordline selectors 21a and 25a are connected to the first initial enable line EN0 via an enable signal supplier WLS, and the gates of the first PMOS transistors MPI and the fifth NMOS transistors MN5 in the even numbered subwordline selectors 21a and 25a are connected to the second initial enable line EN1 via an enable signal supplier WLS.

The second control circuit 52 has the same structure as the first control circuit 50, except that the gates of the first PMOS transistor MP1 and fifth NMOS transistor MN5 are connected to different initial enable lines. Specifically, counting from left to right, the gates of the first PMOS transistors MP1 and the fifth NMOS transistors MN5 in the odd numbered subwordline selectors 21a and 25a are connected to the third initial enable line EN2 via an enable signal supplier WLS, and the gates of the first PMOS transistors MP1 and the fifth NMOS transistors MN5 in the even numbered subwordline selectors 21a and 25a are connected to the fourth initial enable line EN3 via an enable signal supplier WLS.

As shown in FIG. 4. each enable signal supplier WLS is an inverter.

Figure 5:
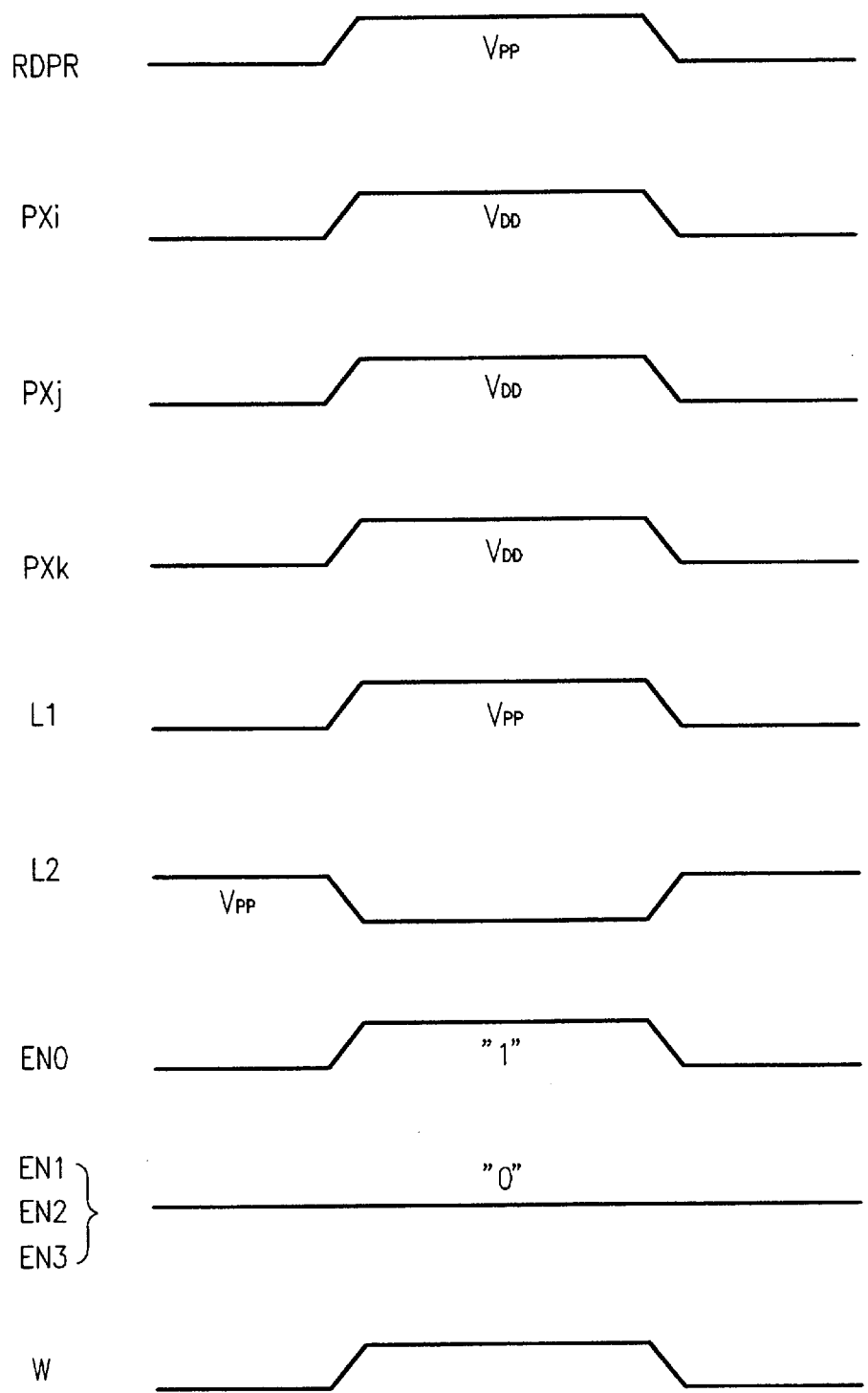
FIG. 5 illustrates waveforms of signals generated by elements in the wordline driving circuit of FIG. 4.

The operation of the subwordline driving circuit will now be described beginning with the operation of the sub-row decoder 20a. As shown in FIG. 5, when the RDPR signal and the address signals PXi–PXj are logic low, the first homo junction PMOS transistor 30a transfers the power source voltage Vpp to the first node N1, and the first row signal on the first row line L1 becomes logic high. The CMOS inverter 31 inverts the logic high first row signal to produce a logic low at the second node N2, and hence, a logic low second row signal on the second row line L2. Namely, when the first node Ni is logic high, the inverter NMOS transistor 31b turns on pulling the second node N2 to ground.

As further shown in FIG. 5, if the RDPR signal and the address signals PXi–PXj are logic high, the first homo junction PMOS transistor 30a is off and the first-fourth NMOS transistors MN1–MN4 are on. Accordingly, the first node N1 is pulled to ground, and the first row signal on the first row line L1 becomes logic low. The CMCS inverter 31 inverts the logic low first row signal to produce a logic high at the second node N2, and hence, a logic high second row signal on the second row line L2. Namely, when the first node N1 is logic low, the inverter PMOS transistor 31a turns on transferring the power source voltage Vpp to the second node N2.

Next, the operation of the subwordline selectors 21a and 25a will be described. Because these subwordline selectors 21a and 25a have the same structure, only the subwordline selectors 21a will be described. Furthermore, because the first and second control circuits 50 and 52 have the same structure, only the first control circuit 50 in the subwordline selectors 21a will be described.

When the one of the first-fourth initial enable signal lines EN0-EN3 to which the gates of the first PMOS transistor MP1 and the fifth NMOS transistor MN5 in a first control circuit 50 are connected is logic high, the enable signal supply WLS outputs a logic low enable signal. As a result, the first PMOS transistor MP1 turns on, and the first row signal is transferred to the third node N3. If the first row signal is logic high, the associated wordline W is driven (see FIG. 5). But, if the first row signal is logic low, then the associated wordline W is not driven. Instead, the second row address will be logic high, and the sixth NMOS transistor MN6 turns on and pulls the associated wordline W to ground. Accordingly, when wordlines associated with a sub-row decoder 20a are not being driven, any noise on the wordline W is removed by operation of the sixth NMOS transistor MN6.

If the one of the first-fourth initial enable signal lines EN0–EN3 to which the gates of the first PMOS transistor MP1 and the fifth NMOS transistor MN5 in a first control circuit 50 are connected is logic low, then regardless of the state of the first and second row signals, the fifth NMOS transistor MN5 turns on pulling the associated wordline W to ground.

Figure 3:
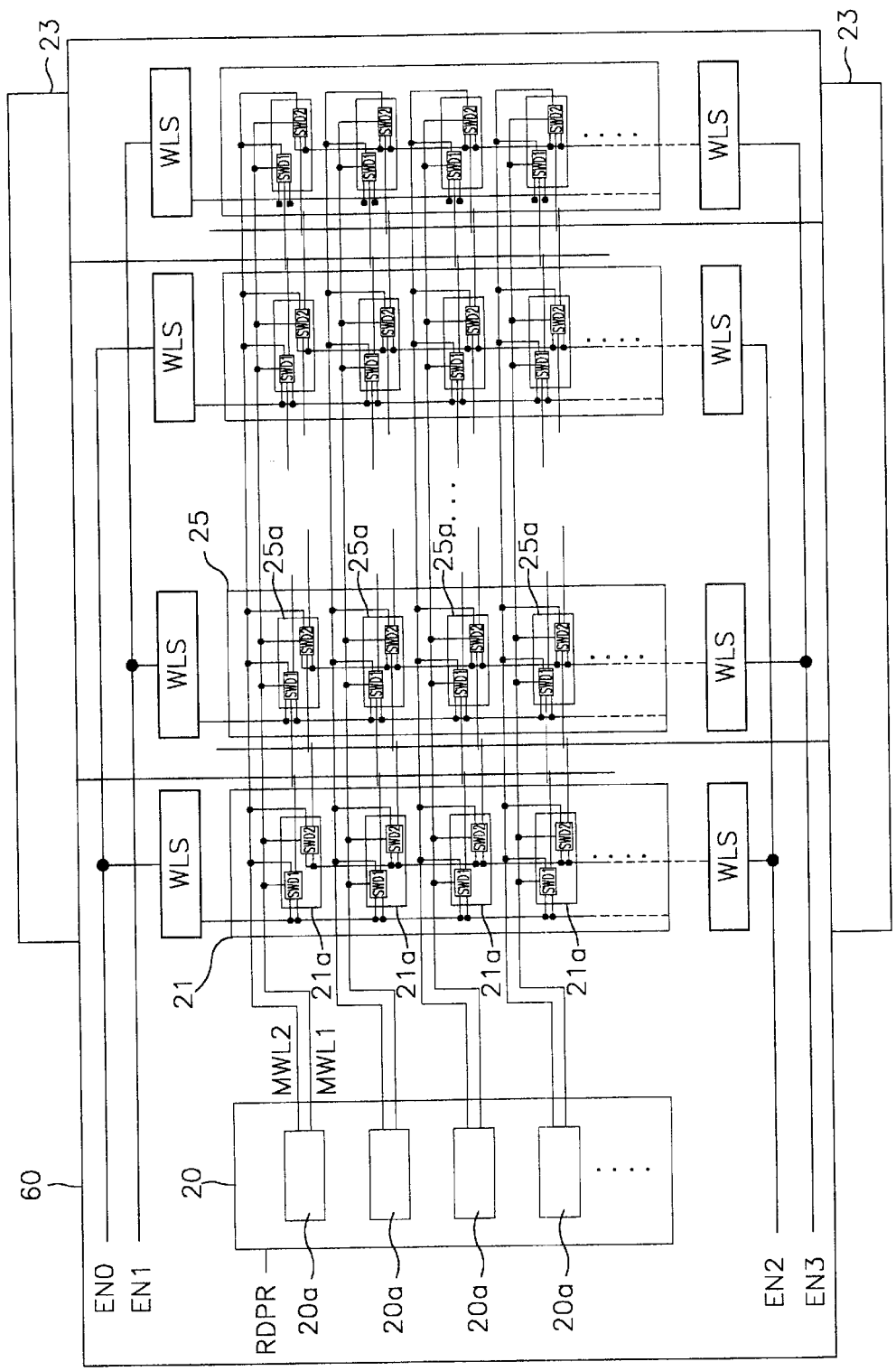
FIG. 3 illustrates a larger portion of the wordline driving ciruit according to the present of the invention.

FIG. 3 illustrates a larger portion of the wordline driving circuit according to the present invention. As shown, the wordline driving circuit includes a row decoder 20 and a plurality of subwordline drivers 21 and 25 associated therewith. The row decoder 20 includes a plurality of sub-row decoders 20a, and each subwordline driver 21 and 25 includes a plurality of subwordline selectors 21a and 25a, respectively. As further shown, each subwordline selector 21a and 25a in a subwordline driver 21 and 25 is associated with a sub-row decoder 21a in the row decoder 20. Collectively, FIG. 3 will be referred to as a wordline driver block 60.

Figure 1:
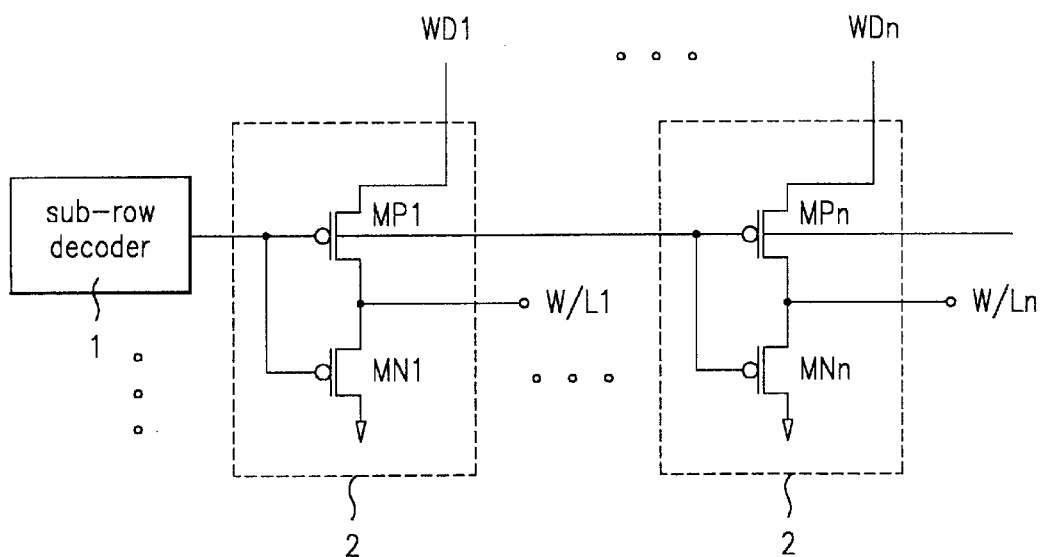
FIG. 1 illustrates a conventional wordline driving circuit.
Figure 2:
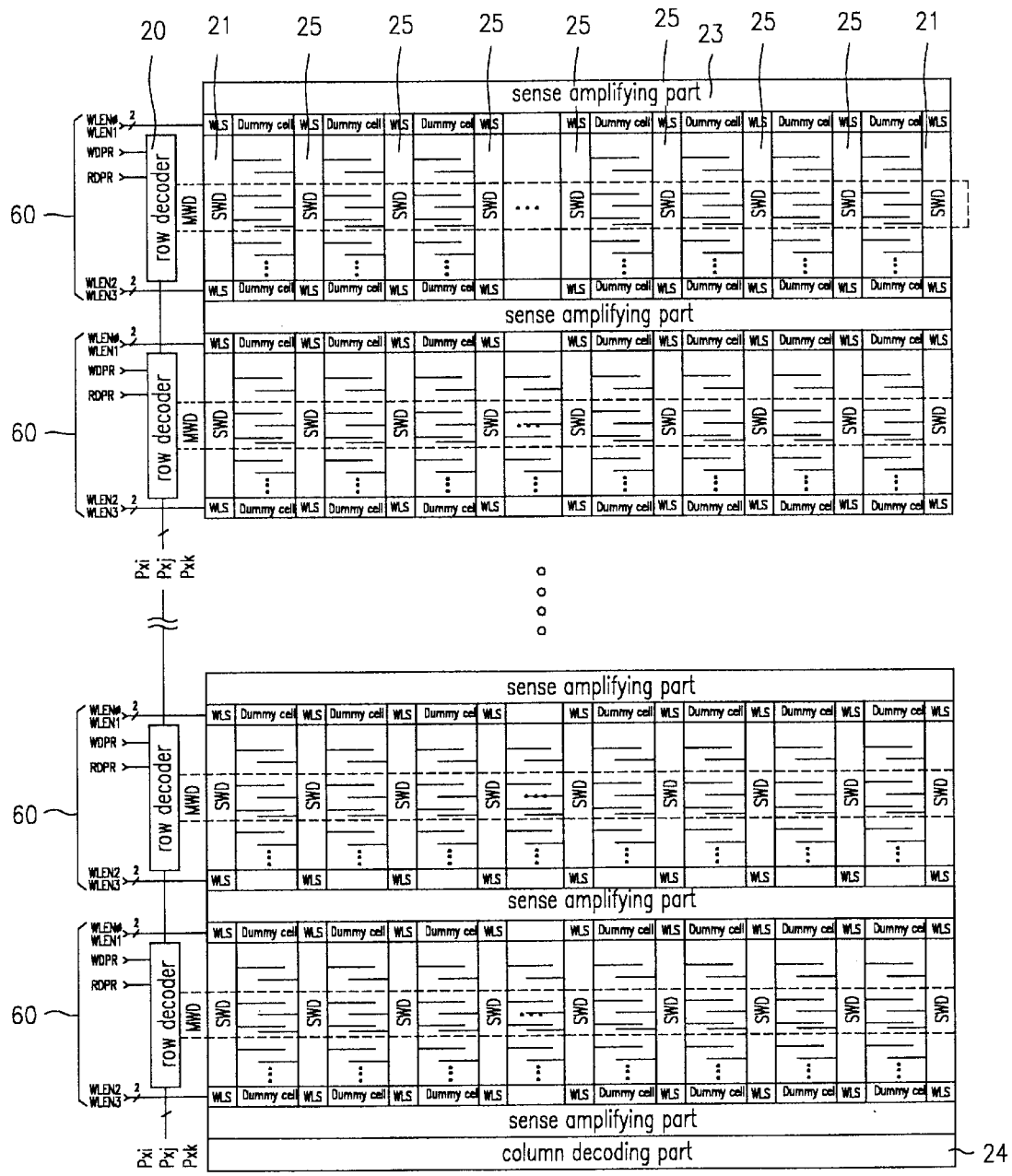
FIG. 2 illustrates the entire wordline driving circuit according to the present of the invention.

FIG. 2 illustrates the entire wordline driving circuit according to the present invention. As shown, the wordline driving circuit is composed of several wordline driver blocks 60.

It will be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

What is claimed is:

1. A wordline driving circuit, comprising:

at least one sub-row decoder decoding address signals to generate at least a first row signal; and at least one subwordline drive selector associated with the sub-row decoder and including at least a first control circuit, the first control circuit receiving the first row signal and a first enable signal, the first control circuit driving at least a first wordline when the first row signal and the first enable signal are active, and the first control circuit including a first noise prevention circuit which eliminates noise in the first wordline when the first row signal is inactive.

2. The wordline driving circuit of claim 1, wherein the sub-row decoder generates the first row signal and a second row signal, the second row signal having an opposite logic state from the first row signal; and the first noise prevention circuit is triggered by the second row signal.

3. The wordline driving circuit of claim 2, wherein the first noise prevention circuit comprises:

a transistor connected between the first wordline and ground, and receiving the second row signal at a gate thereof.

4. The wordline driving circuit of claim 1, wherein the first control circuit further comprises:

a transfer circuit transferring the first row signal to the first wordline based on the first enable signal.

5. The wordline driving circuit of claim 4, wherein the transfer circuit includes, a PMOS transistor having a first source, first drain and first gate, the first source receiving the first row signal, and the first gate receiving the first enable signal, and a first NMOS transistor having a second source, second drain and second gate, the second drain connected to the first drain and the first wordline, the second source connected to a logic level low voltage, and the second gate receiving the first enable signal; and the first noise prevention circuit includes, a second NMOS transistor having a third source, third drain and third gate, the third drain connected to the first wordline, the third source connected to a logic level low voltage, and the third gate receiving the second row signal.

6. The wordline driving circuit of claim 2, wherein the sub-row decoder comprises:

a first row signal generator generating the first row signal based on the address signals; and an inverter inverting the first row signal to generate the second row signal.

7. The wordline driving circuit of claim 1, wherein the first noise prevention circuit comprises:

a transistor connected between the first wordline and ground, and receiving an inverse of the first row signal at a gate thereof.

8. The wordline driving circuit of claim 1, wherein the first control circuit further comprises:

a transfer circuit transferring the first row signal to the wordline based on the first enable signal.

9. The wordline driving circuit of claim 8, wherein the transfer circuit includes, a PMOS transistor having a first source, first drain and first gate, the first source receiving the first row signal, and the first gate receiving the first enable signal, and a first NMOS transistor having a second source, second drain and second gate, the second drain connected to the first drain and the first wordline, the second source connected to a logic level low voltage, and the second gate receiving the first enable signal; and the first noise prevention circuit includes, a second NMOS transistor having a third source, third drain and third gate, the third drain connected to the first wordline, the third source connected to a logic level low voltage, and the third gate receiving the an inverse of the first row signal.

10. The wordline driving circuit of claim 1, wherein the subwordline drive selector further comprises:

a second control circuit receiving the first row signal and a second enable signal, the second control circuit driving at least a second wordline when the first row signal and the second enable signal are active, and the first control circuit including a second noise prevention circuit which eliminates noise in the second wordline when the first row signal is inactive.

11. The wordline driving circuit of claim 10, wherein the first control circuit further includes, a first transfer circuit transferring the first row signal to the wordline based on the first enable signal; and the second control circuit further includes, a second transfer circuit transferring the first row signal to the wordline based on the second enable signal.

12. The wordline driving circuit of claim 10, further comprising:

at least one row decoder including a plurality of the sub-row decoders; and a plurality of the subwordline drive selectors associated with each of the sub-row decoders.

13. The wordline driving circuit of claim 12, further comprising:

a plurality of the row decoders.

14. The wordline driving circuit of claim 1, further comprising:

at least one row decoder including a plurality of the sub-row decoders; and a plurality of the subwordline drive selectors associated with each of the sub-row decoders.

15. The wordline driving circuit of claim 14, further comprising:

a plurality of the row decoders.

16. The wordline driving circuit of claim 1, further comprising:

an inverter inverting a first initial enabling signal to generate the first enable signal.

* * * * *